(12) United States Patent
Suzuki et al.

(10) Patent No.: US 7,875,957 B2
(45) Date of Patent: Jan. 25, 2011

(54) SEMICONDUCTOR SUBSTRATE FOR EPITAXIAL GROWTH AND MANUFACTURING METHOD THEREOF

(75) Inventors: Kenji Suzuki, Kitaibaraki (JP); Ryuichi Hirano, Kitaibaraki (JP); Hideki Kurita, Kitaibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 0 days.

(21) Appl. No.: 12/438,636

(22) PCT Filed: Aug. 17, 2007

(86) PCT No.: PCT/JP2007/066014
§ 371 (c)(1),
(2), (4) Date: Feb. 24, 2009

(87) PCT Pub. No.: WO2008/023639
PCT Pub. Date: Feb. 28, 2008

(65) Prior Publication Data
US 2009/0269271 A1    Oct. 29, 2009

(30) Foreign Application Priority Data
Aug. 25, 2006 (JP) ............... 2006-229171

(51) Int. Cl.
*C01B 19/00* (2006.01)
*C01B 19/04* (2006.01)
*H01L 29/22* (2006.01)

(52) U.S. Cl. ............... 257/614; 423/508; 423/509; 117/956; 117/957

(58) Field of Classification Search ............... 423/508, 423/509; 257/614; 117/956, 957
See application file for complete search history.

(56) References Cited

U.S. PATENT DOCUMENTS 4,487,640 A * 12/1984 Erstfeld ............... 117/99
4,648,917 A *  3/1987 Kay et al. ............ 117/105

FOREIGN PATENT DOCUMENTS

| JP | 60-215600 A | 10/1985 |
| JP | 62-290135 A | 12/1987 |
| JP | 63-21300 A | 1/1988 |
| JP | 2-239188 A | 9/1990 |
| JP | 6-125148 A | 5/1994 |
| JP | 6-92278 B2 | 11/1994 |
| JP | 6-345598 A | 12/1994 |
| WO | WO-2005/112106 A1 | 11/2005 |

OTHER PUBLICATIONS

Erné et al., "Surface films on HgCdTe and CdTe etched in ferricyanide solution" Applied Surface Science, May 15, 2001, vols. 175-176, pp. 579-584, paragraphs of "1. Introduction", "4. Discussion".

* cited by examiner

*Primary Examiner*—Timothy C Vanoy
(74) *Attorney, Agent, or Firm*—Birch, Stewart, Kolasch & Birch, LLP

(57) ABSTRACT

Provided is a semiconductor substrate for epitaxial growth which does not require any etching treatment as a pretreatment in the stage of performing an epitaxial growth of HgCdTe film. A CdTe system compound semiconductor substrate for the epitaxial growth of the HgCdTe film is housed in an inactive gas atmosphere, in a predetermined period of time (for example, 10 hours) after mirror finish treatment thereof, to thereby regulate the proportion of Te oxide of the total amount of Te on the substrate surface which is obtained by XPS measurement so as to be not more than 30%.

2 Claims, No Drawings

SEMICONDUCTOR SUBSTRATE FOR EPITAXIAL GROWTH AND MANUFACTURING METHOD THEREOF

TECHNICAL FIELD

The present invention relates to a semiconductor substrate for epitaxial growth, suitable for epitaxial growth of HgCdTe film, and a manufacturing method thereof, and specifically, relates to CdTe substrate or CdZnTe substrate.

BACKGROUND ART

Conventionally, as an infrared ray sensor to detect an infrared ray, for example, p-n junction diode in which an epitaxially grown HgCdTe film is formed on CdTe system compound semiconductor substrate such as CdTe substrate, CdZnTe substrate, and the like, to be used as a photodiode is known.

The substrate for epitaxial growth to form the epitaxially grown HgCDTe film is subjected to a mirror finish by a method disclosed for example in Patent Document 1. To put it concretely, the CdTe substrate for epitaxial growth is subjected to the following procedures: CdTe single crystal obtained by a vertical Bridgman method or the like is thinly cut; the thinly cut CdTe single crystal is lapped, etched, polished, and the like; and eventually final polishing to finish the wafer surface to be a minor surface is performed. There are for example, minor etching method and mirror polishing method, as the final polishing.

Further, in the Patent Document 1, mirror polishing solution which is suitable for the mirror polishing method is suggested, and thus a mirror surface with less waviness and surface anomalies can be obtained.

By the way, the substrate for epitaxial growth which has been subjected to the mirror finish in the above described method, is usually not used for the epitaxial growth immediately as it is, but is used for the epitaxial growth after having been stored for a predetermined period of time. At this point, the substrates for epitaxial growth are required to keep their surfaces clean, and thus, are stored in a state of being housed in a wafer storage container one by one. For example, Patent Document 2 discloses a wafer storage container which is suitable for storing the substrates for epitaxial growth.

In a case where the substrates for epitaxial growth are stored by being housed in the above mentioned wafer storage container, particles may be attached to the front and rear surfaces of the semiconductor wafer. Thus, generally, the wafer storage container in which wafers are housed is wrapped up by a laminated bag, the interior of the laminated bag is discharged with air so as to be filled with inactive gas such as nitrogen gas, or the like, and the laminated bag is sealed so as to block contact with external air. Therefore, the particles are prevented from entering into the wafer storage container from outside.

On the surface of the CdTe substrate which has been stored for the predetermined period of time, not a few oxidized films which prevent normal epitaxial growth are formed. Conventionally, an etching treatment by $Br_2$ methanol is performed in order to remove the oxidized films as a pretreatment of the epitaxial growth.

Patent Document 1: JP-Tokukou-Hei-6-92278A
Patent Document 2: WO2005/112106A1

DISCLOSURE OF THE INVENTION

Problems to be Solved by the Invention

However, the etching treatment as the pretreatment of the epitaxial growth is troublesome, and moreover, the etching treatment itself deteriorates the quality of the substrate surface. Thus, there is a problem of increasing the defects of an epitaxial growth film which is formed on the substrate.

The object of the present invention is to decrease the generation of defects on the HgCdTe growth film, by providing a semiconductor substrate for epitaxial growth which does not require the etching treatment as the pretreatment, when performing the epitaxial growth of HgCdTe film.

Means for Solving the Problem

The present invention is made in order to solve the aforementioned problem, and provided is a CdTe system compound semiconductor substrate to perform an HgCdTe epitaxial growth, wherein the substrate is housed in an inactive gas atmosphere in a predetermined amount of time after the substrate has been subjected to a mirror finish treatment, and wherein a proportion of a Te oxide of a total amount of Te on a surface of the substrate is not more than 30%, the proportion being able to be obtained by an XPS measurement. Particularly, provided is a substrate for epitaxial growth comprising CdTe or CdZnTe.

Here, "total amount of Te" means the amount including the simple substance of Te, and Te compound. Further, "a mirror finish treatment" is the finishing treatment which is eventually performed after the polishing/cleansing treatment and the like for the substrate, which is performed by, for example, the mirror polishing method, the mirror etching method, or the like.

Further, as a method to house the CdTe system compound semiconductor substrate in an inactive gas atmosphere, for example, there is a method in which the substrate for epitaxial growth is housed in a predetermined wafer storage container, the wafer storage container is wrapped up by a laminated bag, the interior of the laminated bag is discharged with air so as to be filled with nitrogen gas, and the laminated bag is sealed, or the like.

Moreover, a manufacturing method of a semiconductor substrate for an epitaxial growth to perform an HgCdTe epitaxial growth, comprises:

housing the substrate in an inactive gas atmosphere in 10 hours after the substrate has been subjected to a mirror finish treatment. Thereby, the proportion of the Te oxide of the total amount of Te on the surface of the substrate, obtained by the XPS measurement, results in the above described range.

Hereinafter, a description is given as to how the present invention has been completed.

Conventionally, in a case where CdTe substrate which has been subjected to the mirror finish is housed in a predetermined wafer storage container, and is stored for a predetermined period of time, then is used for epitaxial growth of HgCdTe film, the etching treatment by $Br_2$ methanol has been performed in order to remove the oxidized films (mainly Te oxide) formed on the surface of the CdTe substrate as the pretreatment of the epitaxial growth. This is because when the oxidized films are formed on the substrate surface, defects are generated in the epitaxial growth film, and epitaxial growth film with fine quality cannot be obtained.

However, even when the etching treatment by $Br_2$ methanol is performed, defects are generated in the epitaxial growth film formed on the CdTe substrate, thus there seemed to have been room for further improvement. Moreover, the etching treatment is effective in removing the oxidized films (such as Te oxide) formed on the CdTe substrate surface, however, the etching treatment deteriorates the quality of the substrate surface, and the defects are estimated to be generated in the epitaxial growth film Thus, on the basis of the observation that performing the etching treatment as the pretreatment of the epitaxial growth of HgCdTe film on the CdTe substrate is not preferable, the inventors assumed that an epitaxial growth film with fine quality can be formed without the etching treatment, by reducing the oxidized films formed on the substrate surface while being stored.

Further, after examining the relationship between the amount of Te oxide formed on the CdTe substrate surface and the defects generated in the HgCdTe growth film, the inventors discovered that the defects generated in the HgCdTe growth film can effectively be reduced, when the Te oxide accounts for the proportion (amount of Te oxide/total amount of Te) of not more than 30% of the total amount of Te on the substrate surface which is measured by XPS.

Moreover, the inventors examined the relationship between the time in which the CdTe substrate is exposed to air, and the amount of the oxidized films on the surface thereof, thus discovered that the amount of the oxidized films formed on the substrate surface can be controlled so as to be in the above mentioned range, by controlling the time in which the CdTe substrate is exposed to the air. Moreover, by housing and storing the CdTe substrate which has been subjected to the mirror finish, in a nitrogen gas atmosphere, the formation of the oxidized film (Te oxide) on the substrate surface can be prevented from proceeding while being stored. Thus, the inventors focused attention on the time until the substrate which has been subjected to the mirror finish is stored in the nitrogen gas atmosphere, and established the method of controlling the Te oxide to be formed on the CdTe substrate surface by controlling the time.

Table 1 shows the time until the CdTe substrate which has been subjected to the mirror finish is stored in the nitrogen gas atmosphere, and the proportion (%) of the Te oxide of the total amount of Te when the CdTe substrate surface is measured by XPS. Incidentally, the XPS measurement of the CdTe substrate surface is performed after the CdTe substrate which had been subjected to the mirror finish, has been stored for 30 days in the state of being housed in the nitrogen gas atmosphere.

TABLE 1

| TIME UNTIL SUBSTRATE SUBJECTED TO MIRROR FINISH IS HOUSED IN NITROGEN GAS ATMOSPHERE | AMOUNT OF Te OXIDE/TOTAL AMOUNT OF Te (%) ON SUBSTRATE SURFACE |
|---|---|
| 5 MINUTES | 7 |
| 15 MINUTES | 13 |
| 60 MINUTES | 15 |
| 180 MINUTES | 17 |
| 300 MINUTES | 26 |
| 600 MINUTES | 29 |
| 1 DAY | 45 |
| 30 DAYS | 82 |
| 120 DAYS | 80 |

As shown in Table 1, the longer the time until the substrate which has been subjected to the mirror finish is housed in the nitrogen gas atmosphere is, the higher the proportion (amount of Te oxide/total amount of Te) of the Te oxide of the total amount of Te becomes, and it can be founded that the formation of Te oxide has proceeded. To put it concretely, in the cases where the time until the substrate which has been subjected to the mirror finish is housed in the nitrogen gas atmosphere is 5 minutes, 15 minutes, 60 minutes, 180 minutes, and 600 minutes, respectively, (amount of Te oxide/total amount of Te) gradually increases. Further, (amount of Te oxide/total amount of Te) becomes 45% in 1 day, and becomes not less than 80% in a state of being saturated in not less than 30 days.

Further, when the Te oxide accounts for the proportion (amount of Te oxide/total amount of Te) of not more than 30% of the total amount of Te on the CdTe substrate surface, the defects generated in the HgCdTe growth film can effectively be reduced. Thus, by housing the CdTe substrate which has been subjected to the mirror finish, in the nitrogen gas atmosphere within 600 minutes (10 hours), the influence which the surface oxidized film of the CdTe substrate stored in such a state causes to the HgCdTe epitaxial growth can extremely be reduced.

The present invention was completed on the basis of the above described perception, and provided is CdTe system compound semiconductor substrate in which the Te oxide accounts for the proportion (amount of Te oxide/total amount of Te) of not more than 30% of the total amount of Te on the substrate surface. Further, in order to obtain the above CdTe system compound semiconductor substrate, the substrate which has been subjected to the mirror finish, may be stored in the nitrogen gas atmosphere within 10 hours after the mirror finish.

Effect of the Invention

According to the present invention, in the CdTe system semiconductor substrate (for example, CdTe substrate or CdZnTe substrate) to perform the epitaxial growth of the HgCdTe film, the oxidized film which is formed on the substrate surface after having been subjected to the mirror finish, that is to say the amount of the Te oxide, is controlled to be in the range of not more than 30% of the total amount of Te. Thus, the defects generated in the epitaxial growth film can effectively be reduced.

Further, the etching treatment (for the purpose of removing the oxidized film) as the pretreatment of the epitaxial growth is not required. Thus, the conventionally performed etching treatment can be omitted. Further, the deterioration of the quality of the substrate surface owing to the etching treatment, and the generation of the defects after the epitaxial growth can be prevented.

BEST MODE FOR CARRYING OUT THE INVENTION

Hereinbelow, a preferred embodiment of the present invention will be explained.

First, CdTe single crystal is grown by the vertical Bridgman method which has been conventionally used as a growing method of CdTe single crystal. Then, the CdTe substrate which is thinly cut out from the obtained CdTe single crystal is performed with lapping, etching, and polishing/cleansing treatment such as polishing and the like. Subsequently, the mirror finish treatment by the final polishing treatment is performed. This mirror finish treatment is disclosed for example in JP-Tokukai-Shou-62-290135.

The CdTe substrate with the mirror finish obtained by the above described manner is housed in the predetermined wafer storage container, and is stored for a predetermined period of time. Subsequently, the CdTe substrate is removed from the wafer storage container, and HgCdTe film is epitaxially grown on the substrate.

Embodiment

In the embodiment, the above mentioned CdTe substrate with the mirror finish is housed in the wafer storage container, stored in the air for 180 minutes or for 600 minutes, and housed in the nitrogen gas atmosphere. To put it concretely, the wafer storage container in which the CdTe substrate is housed is wrapped up by a laminated bag, the interior of the laminated bag is discharged with air so as to be filled with nitrogen gas, and the laminated bag is sealed so as to obtain nitrogen gas atmosphere. That is to say, the time from the mirror finish until the sealing of the laminated bag is 180 minutes, or 600 minutes.

Subsequently, after the substrate is stored in the nitrogen gas atmosphere for 30 days, the CdTe substrate is removed form the wafer storage container, so as to epitaxially grow the HgCdTe film on the substrate (without the etching treatment as pretreatment).

Table 2 shows the amount of Te oxide/total amount of Te on the CdTe substrate surface, and the number of defects generated in the HgCdTe growth film. Incidentally, the amount of Te oxide/total amount of Te on the CdTe substrate surface is calculated by the total amount of Te and the amount of Te oxide when the CdTe substrate surface is measured by XPS. Further, the number of defects generated in the HgCdTe growth film is shown by the density calculated from a measurement value of defects which are within visible field when the surface of the growth film is observed by an optical microscope (×200).

As shown in Table 2, in a case where the substrate is housed in the nitrogen gas atmosphere in 180 minutes from the mirror finish treatment, (the amount of Te oxide/total amount of Te) was 17%, and the number of defects generated in the HgCdTe growth film was 450/cm$^2$. Further, in a case where the substrate is housed in the nitrogen gas atmosphere in 600 minutes from the mirror finish treatment, (the amount of Te oxide/total amount of Te) was 26%, and the number of defects generated in the HgCdTe growth film was 489/cm$^2$.

In either of the cases, the amount of Te oxide/total amount of Te on the CdTe substrate surface before it is used for the epitaxial growth was not more than 30%. Thus, the number of defects generated in the HgCdTe growth film was few, and the HgCdTe film with extremely fine quality can be grown.

Comparative Example 1

In the comparative example 1, the above mentioned CdTe substrate with the mirror finish is housed in the wafer storage container, stored in the air for 1 day, 30 days, or 120 days, and housed in the nitrogen gas atmosphere. The substrate is housed in the nitrogen gas atmosphere in the same manner as in the embodiment.

Subsequently, after the substrate is stored in the nitrogen gas atmosphere for 30 days, the CdTe substrate is removed from the wafer storage container, so as to epitaxially grow the HgCdTe film on the substrate (without the etching treatment as pretreatment).

Table 3 shows the amount of Te oxide/total amount of Te on the CdTe substrate surface, and the number of defects generated in the HgCdTe growth film.

As shown in Table 3, in a case where the substrate is housed in the nitrogen gas atmosphere in 1 day from the mirror finish treatment, (the amount of Te oxide/total amount of Te) was 45%, and the number of defects generated in the HgCdTe growth film was 1700/cm$^2$. Further, in a case where the substrate is housed in the nitrogen gas atmosphere in 30 days from the mirror finish treatment, (the amount of Te oxide/total amount of Te) was 82%, and the number of defects generated in the HgCdTe growth film was 3350/cm$^2$. Moreover, in a case where the substrate is housed in the nitrogen gas atmosphere in 120 days from the mirror finish treatment, (the amount of Te oxide/total amount of Te) was 80%, and the number of defects generated in the HgCdTe growth film was 3100/cm$^2$.

In either of the cases, the amount of Te oxide on the CdTe substrate surface before it is performed with the epitaxial growth is large, compared to the embodiment, it can be said that the number of defects generated in the HgCdTe growth film has increased.

TABLE 2

| TIME UNTIL SUBSTRATE IS HOUSED IN NITROGEN GAS ATMOSPHERE FROM MIRROR FINISH PROCESSING | AMOUNT OF Te OXIDE/ TOTAL AMOUNT OF Te ON SUBSTRATE SURFACE (%) | NUMBER OF DEFECTS IN HgCdTe GROWTH FILM (/cm$^2$) |
|---|---|---|
| 180 MINUTES | 17 | 450 |
| 600 MINUTES | 26 | 489 |

TABLE 3

| TIME UNTIL SUBSTRATE IS HOUSED IN NITROGEN GAS ATMOSPHERE FROM MIRROR FINISH PROCESSING | AMOUNT OF Te OXIDE/ TOTAL AMOUNT OF Te ON SUBSTRATE SURFACE (%) | NUMBER OF DEFECTS IN HgCdTe GROWTH FILM (/cm$^2$) |
|---|---|---|
| 1 DAY | 45 | 1700 |
| 30 DAYS | 82 | 3350 |
| 120 DAYS | 80 | 3100 |

Comparative Example 2

In the comparative example 2, the above mentioned CdTe substrate with the mirror finish is housed in the wafer storage container, and is stored in the air for 30 days. Subsequently, the CdTe substrate is removed from the wafer storage container, the etching treatment by Br$_2$ methanol is performed to the substrate, and then, the HgCdTe film is epitaxially grown.

Table 4 shows the number of defects generated in the HgCdTe growth film. As shown in Table 4, in a case where the CdTe substrate which has been subjected to the mirror finish is stored in the air, the number of defects generated in the HgCdTe growth film was 2300/cm$^2$.

In a case where the HgCdTe film is grown on the CdTe substrate performed with the etching by Br$_2$ methanol, the Te oxidized film formed on the substrate surface is removed. However, the surface quality is deteriorated, and thus, the number of defects generated in the HgCdTe growth film has increased. Compared to the results of the embodiment, the number of defects in the HgCdTe growth film was approximately 5 times as many. Further, compared to the results of the comparative example 1, in a case where the substrate is stored in the air for not less than 30 days, the number of defects in the HgCdTe growth film can be reduced when the etching treatment by Br$_2$ methanol is performed. However, in a case where the substrate is stored in the air for about 1 day, the number of defects in the HgCdTe growth film can be reduced when the etching treatment by Br$_2$ methanol is not performed.

TABLE 4

| STORED IN AIR | NUMBER OF DEFECTS IN HgCdTe GROWTH FILM (/cm$^2$) |
|---|---|
| 30 DAYS | 2300 |

As described above, by making the amount of Te oxide/ total amount of Te on the CdTe substrate surface before epitaxially growing the HgCdTe film be not more than 30%, the number of defects generated in the HgCdTe film can extremely be reduced compared to the case in which the etching treatment is performed as pretreatment. In this case, it is preferable that time until the substrate which has been subjected to the mirror finish is stored in the nitrogen gas atmosphere is not more than 10 hours.

Further, the etching treatment need not be performed. Thus, the conventionally performed etching treatment can be omitted. Moreover, the deterioration of the quality of the substrate surface owing to the etching treatment, and the generation of the defects on the surface owing to the deterioration of the surface quality can be prevented. Therefore, the HgCdTe film with extremely fine quality can be grown.

Hereinabove, the present invention made by the inventors is specifically described based on the embodiment. However, the present invention is not limited to the aforementioned embodiment and can be modified without departing from the scope of the invention. For example, the case where the CdTe single crystal was used as the substrate has been explained. However, in a case where another CdTe system compound semiconductor single crystal (for example, CdZnTe single crystal) is used as the substrate for the epitaxial growth, the same effect can be obtained.

The invention claimed is:

1. A CdTe system compound semiconductor substrate to perform an HgCdTe epitaxial growth, wherein the substrate is housed, sealed and stored in a predetermined wafer storage container within 10 hours after the substrate has been subjected to a mirror finish treatment, the predetermined wafer storage container being filled with an inactive gas, and wherein a proportion of a Te oxide of a total amount of Te on a surface of the substrate is not more than 30%, when the substrate is removed from the container and is used for the epitaxial growth, the proportion being able to be obtained by an XPS measurement carried out after the CdTe substrate has been stored for 30 days in the state of being stored.

2. A manufacturing method of a semiconductor substrate for an epitaxial growth to perform an HgCdTe epitaxial growth, comprising: housing, sealing and storing the substrate in a predetermined wafer storage container within 10 hours after the substrate has been subjected to a mirror finish treatment, the predetermined wafer storage container being filled with an inactive gas.

* * * * *

UNITED STATES PATENT AND TRADEMARK OFFICE
CERTIFICATE OF CORRECTION

PATENT NO.         : 7,875,957 B2                                    Page 1 of 1
APPLICATION NO.    : 12/438636
DATED              : January 25, 2011
INVENTOR(S)        : Kenji Suzuki et al.

It is certified that error appears in the above-identified patent and that said Letters Patent is hereby corrected as shown below:

At column 1, line 31, change "minor surface" to --mirror surface--.

At column 1, line 32, change "minor etching method" to --mirror etching method--.

Signed and Sealed this
Twenty-first Day of June, 2011

David J. Kappos
*Director of the United States Patent and Trademark Office*